(12) United States Patent
Wu et al.

(10) Patent No.: US 10,692,443 B2
(45) Date of Patent: Jun. 23, 2020

(54) SYNCHRONOUS BACKLIGHT DEVICE AND OPERATION METHOD THEREOF

(71) Applicant: Novatek Microelectronics Corp., Hsinchu (TW)

(72) Inventors: Chung-Wen Wu, Yilan County (TW); Wen-Chi Lin, Yilan County (TW); Sih-Ting Wang, Kaohsiung (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 15/828,396

(22) Filed: Nov. 30, 2017

(65) Prior Publication Data

US 2019/0164506 A1 May 30, 2019

(51) Int. Cl.
*G09G 3/34* (2006.01)
*H03K 7/08* (2006.01)
*G02F 1/13357* (2006.01)

(52) U.S. Cl.
CPC ..... *G09G 3/3406* (2013.01); *G02F 1/133602* (2013.01); *H03K 7/08* (2013.01); *G09G 2310/0264* (2013.01); *G09G 2310/08* (2013.01)

(58) Field of Classification Search
CPC ......... G09G 3/3406; G09G 2310/0264; G09G 2310/08; G02F 1/113602; H03K 7/08
See application file for complete search history.

(56) References Cited

U.S. PATENT DOCUMENTS

| | | | | |
|---|---|---|---|---|
| 8,065,552 | B2 * | 11/2011 | Sano | G11B 20/10222 327/156 |
| 9,363,069 | B2 * | 6/2016 | Wang | G06F 1/08 |
| 2006/0103609 | A1 * | 5/2006 | Ho | G09G 3/2022 345/76 |
| 2006/0284826 | A1 * | 12/2006 | Kawaguchi | G09G 3/2059 345/102 |
| 2007/0057639 | A1 * | 3/2007 | Sun | H05B 41/2828 315/209 R |
| 2007/0182700 | A1 * | 8/2007 | Baba | G09G 3/20 345/102 |
| 2007/0211014 | A1 * | 9/2007 | Kim | G09G 3/3406 345/102 |
| 2008/0129663 | A1 * | 6/2008 | Honda | G09G 3/3406 345/84 |

(Continued)

Primary Examiner — Amare Mengistu
Assistant Examiner — Crystal Mathews
(74) Attorney, Agent, or Firm — JCIPRNET

(57) ABSTRACT

A synchronous backlight device and an operation method thereof are provided. The synchronous backlight device includes a pulse width modulation (PWM) control circuit and a backlight driving circuit. The PWM control circuit receives the video sync information from a video processing circuit and generates a PWM control signal. Wherein, the video sync information defines a plurality of video frame periods, the PWM control circuit at least divides each of the video frame periods into a first period and a second period, the lengths of the first periods of the video frame periods are equal to one another. The frequency of the PWM control signal in the first periods is different from the frequency of the PWM control signal in the second periods. The backlight driving circuit drives the backlight source of a display panel in accordance with the PWM control signal.

13 Claims, 8 Drawing Sheets

(56) References Cited

U.S. PATENT DOCUMENTS

| | | | | |
|---|---|---|---|---|
| 2008/0266241 A1* | 10/2008 | Kimura | G09G 3/3406 | 345/102 |
| 2008/0272276 A1* | 11/2008 | Huang | G09G 3/3406 | 250/205 |
| 2009/0073110 A1* | 3/2009 | Feng | G09G 3/3406 | 345/102 |
| 2009/0096741 A1* | 4/2009 | Kim | G09G 3/342 | 345/102 |
| 2010/0020108 A1* | 1/2010 | Cho | G09G 3/3406 | 345/690 |
| 2010/0091048 A1* | 4/2010 | Aitken | G09G 3/2092 | 345/690 |
| 2010/0164858 A1* | 7/2010 | Kikuchi | G09G 3/3406 | 345/102 |
| 2010/0277214 A1* | 11/2010 | Chang | H03K 5/04 | 327/175 |
| 2010/0302268 A1* | 12/2010 | Jun | G09G 3/3406 | 345/589 |
| 2011/0074301 A1* | 3/2011 | Goder | H05B 33/0818 | 315/210 |
| 2011/0096101 A1* | 4/2011 | Lee | G09G 3/3406 | 345/690 |
| 2011/0175938 A1* | 7/2011 | Lee | G09G 3/3406 | 345/690 |
| 2011/0241560 A1* | 10/2011 | Englert | H05B 33/0815 | 315/287 |
| 2011/0267377 A1* | 11/2011 | Kim | G09G 3/3406 | 345/690 |
| 2011/0292022 A1* | 12/2011 | Lee | G09G 3/003 | 345/212 |
| 2012/0113167 A1* | 5/2012 | Margerm | G09G 3/3426 | 345/690 |
| 2012/0169801 A1* | 7/2012 | Lee | G09G 3/3406 | 345/691 |
| 2012/0306941 A1* | 12/2012 | Chang | G09G 3/3406 | 345/690 |
| 2013/0002529 A1* | 1/2013 | Onogi | G09G 3/342 | 345/102 |
| 2013/0307634 A1* | 11/2013 | Chin | H03K 3/017 | 332/109 |
| 2013/0321254 A1* | 12/2013 | Kim | G09G 3/36 | 345/102 |
| 2014/0159614 A1* | 6/2014 | Hussain | H05B 33/086 | 315/307 |
| 2014/0307011 A1* | 10/2014 | Ninan | G09G 3/342 | 345/691 |
| 2016/0219663 A1* | 7/2016 | Chen | H05B 33/0818 | |
| 2017/0027032 A1* | 1/2017 | Kong | G09G 3/32 | |
| 2017/0071040 A1* | 3/2017 | Kimura | H03K 5/131 | |
| 2018/0103231 A1* | 4/2018 | Ahn | G09G 5/005 | |
| 2018/0122293 A1* | 5/2018 | Lim | G09G 3/2092 | |
| 2018/0300905 A1* | 10/2018 | Johnston | G11B 27/00 | |
| 2018/0315379 A1* | 11/2018 | Du | G09G 3/3406 | |
| 2019/0035344 A1* | 1/2019 | Lin | G09G 3/3406 | |
| 2019/0164507 A1* | 5/2019 | Wu | G09G 3/3406 | |

* cited by examiner

SYNCHRONOUS BACKLIGHT DEVICE AND OPERATION METHOD THEREOF

BACKGROUND

Field of the Invention

The invention relates to a display device and more particularly, to a synchronous backlight device and an operation method thereof.

Description of Related Art

FIG. 1 is a schematic waveform diagram of a backlight control signal BL1 when a backlight device of the related art controls/drives a backlight source in an asynchronous manner. In FIG. 1, the vertical axis represents the voltage, and the horizontal axis represents the time. In FIG. 1, Vsync represents a vertical sync signal, and DE represents a data enablement signal. A video processing circuit (not shown) may transmit the vertical sync signal Vsync and the data enablement signal DE to a panel driving circuit (not shown), so as to control the panel driving circuit to drive a liquid crystal display (LCD) panel (not shown). The vertical sync signal Vsync defines a plurality of video frame periods, for example, video frame periods F1, F2, F3 and F4 as illustrated in FIG. 1. As illustrated in FIG. 1, the backlight control signal BL1 of the backlight device of the related art is unrelated to phases (or timings) of the video frame periods F1, F2, F3 and F4, i.e., the backlight device of the related art controls a backlight source (not shown) in an asynchronous manner. An issue of motion blur may occurs to the LCD panel using the asynchronous backlight.

FIG. 2A is a schematic waveform diagram of a backlight control signal BL2 when the backlight device of the related art controls/drives the backlight source in a synchronous manner. In FIG. 2A, the vertical axis represents the voltage, and the horizontal axis represents the time. In FIG. 2A, Vsync represents a vertical sync signal, and DE represents a data enablement signal. The vertical sync signal Vsync defines a plurality of video frame periods, for example, video frame periods F1, F2, F3 and F4 as illustrated in FIG. 2A. As illustrated in FIG. 2A, a phase (or a timing) of the backlight control signal BL2 of the backlight device of the related art may be synchronous with the video frame periods F1, F2, F3 and F4 in accordance with the vertical sync signal Vsync, i.e., the backlight device of the related art controls/drives a backlight source (not shown) in a synchronous manner. When the backlight control signal BL2 is at a high level, the backlight source provides backlight. When the backlight control signal BL2 is at a low level, the backlight source does not provide backlight. Pulse widths PW2 of the backlight control signal BL2 in the video frame periods F1, F2, F3 and F4 are equal to one another, and the pulse widths PW2 may be modulated according to use requirements.

FIG. 2B is a schematic waveform diagram of a backlight control signal BL2 when the backlight device of another related art controls/drives the backlight source in a synchronous manner. In FIG. 2B, the vertical axis represents the voltage, and the horizontal axis represents the time. The vertical sync signal Vsync and the data enablement signal DE illustrated in FIG. 2B may be derived with reference to the description related to FIG. 2A and thus, will not be repeated. As illustrated in FIG. 2B, a phase (or a timing) of the backlight control signal BL2 of the backlight device of the related art may be synchronous with the video frame periods F1, F2, F3 and F4 in accordance with the data enablement signal DE, i.e., the backlight device of the related art controls/drives a backlight source (not shown) in a synchronous manner. Pulse widths PW2 of the backlight control signal BL2 in the video frame periods F1, F2, F3 and F4 are equal to one another, and the pulse widths PW2 may be modulated according to use requirements. In any case, in an actual application environment, a period length of the vertical sync signal Vsync (a period length of the data enablement signal DE) may not be fixed, lengths of the video frame periods F1, F2 F4 and F4 are different from one another (as illustrated in FIG. 2A and FIG. 2B). For the LCD panel using the synchronous backlight, an issue of backlight flicker may arise to the backlight device of the related art because the period length of the vertical sync signal Vsync is not fixed.

SUMMARY

The invention provides a synchronous backlight device and an operation method thereof for improving the issue backlight flicker.

According to an embodiment of the invention, a synchronous backlight device including a pulse width modulation (PWM) control circuit and a backlight driving circuit is provided. The PWM control circuit is configured to receive video sync information from a video processing circuit and generate a PWM control signal. The video sync information defines a plurality of video frame periods, the PWM control circuit at least divides each of the video frame periods into a first period and a second period, and lengths of the first periods of the video frame periods are equal to one another. A frequency of the PWM control signal in the first periods is different from a frequency of the PWM control signal in the second periods. The backlight driving circuit is coupled to the PWM control circuit to receive the PWM control signal. The backlight driving circuit is configured to drive a backlight source of a display panel according to the PWM control signal.

According to an embodiment of the invention, an operation method of a synchronous backlight device is provided. The operation method includes: receiving video sync information from a video processing circuit, wherein the video sync information defines a plurality of video frame periods; at least dividing each of the video frame periods into a first period and a second period by a PWM control circuit, wherein lengths of the first periods of the video frame periods are equal to one another; generating a PWM control signal by the PWM control circuit, wherein a frequency of the PWM control signal in the first periods is different from a frequency of the PWM control signal in the second periods; and driving a backlight source of a display panel by a backlight driving circuit according to the PWM control signal.

Based on the above, in the synchronous backlight device and the operation method thereof according to the embodiments of the invention, each video frame period is at least divided into the first period and the second period. The lengths of the first periods of various video frame periods are equal to one another. If the length of each video frame period is changed, the lengths of the second periods are changed as well. The frequency of the PWM control signal in the first periods is different from the frequency of the PWM control signal in the second periods. With the backlight source providing compensation light in the second periods, the synchronous backlight device and the operation method thereof can achieve improving the issue of backlight flicker.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
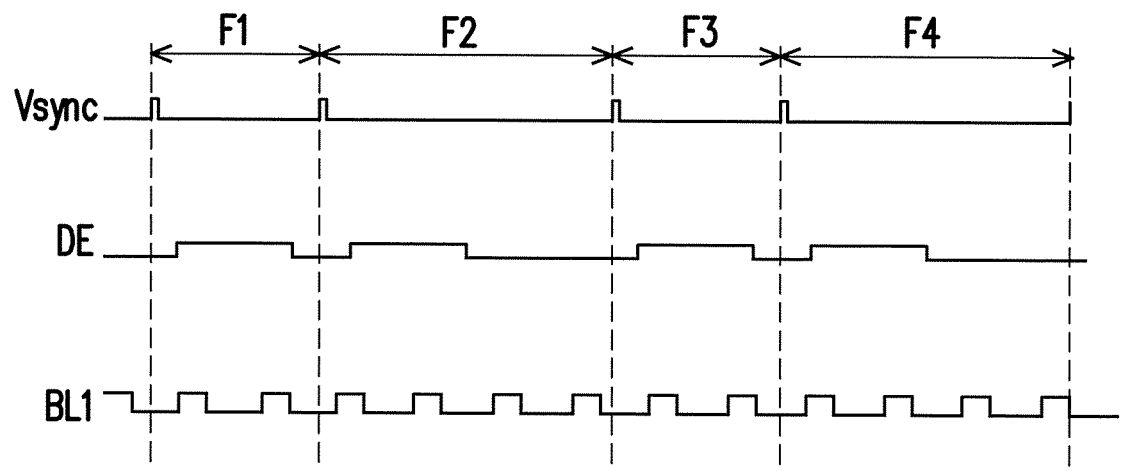
FIG. 1 is a schematic waveform diagram of a backlight control signal when a backlight device of the related art controls/drives a backlight source in an asynchronous manner.
Figure 2A:
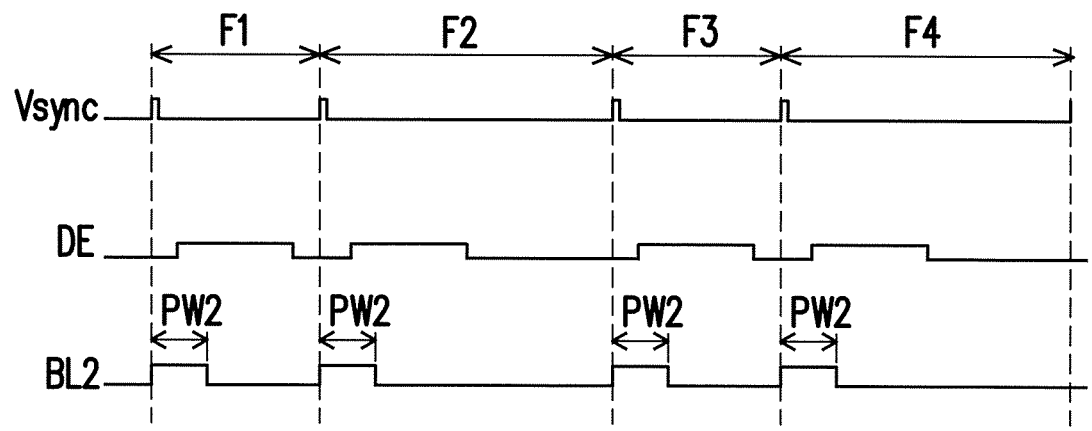
FIG. 2A is a schematic waveform diagram of a backlight control signal when the backlight device of the related art controls/drives the backlight source in a synchronous manner.
Figure 2B:
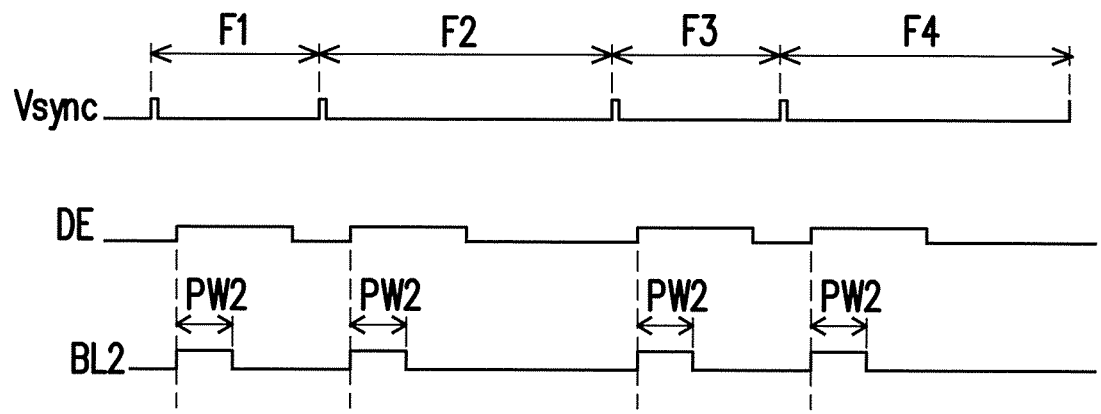
FIG. 2B is a schematic waveform diagram of a backlight control signal BL2 when the backlight device of another related art controls/drives the backlight source in a synchronous manner.

A term "couple" used in the full text of the disclosure (including the claims) refers to any direct and indirect connections. For instance, if a first device is described to be coupled to a second device, it is interpreted as that the first device is directly coupled to the second device, or the first device is indirectly coupled to the second device through other devices or connection means. Moreover, wherever possible, components/members/steps using the same referral numerals in the drawings and description refer to the same or like parts. Components/members/steps using the same referral numerals or using the same terms in different embodiments may cross-refer related descriptions.

Figure 3:
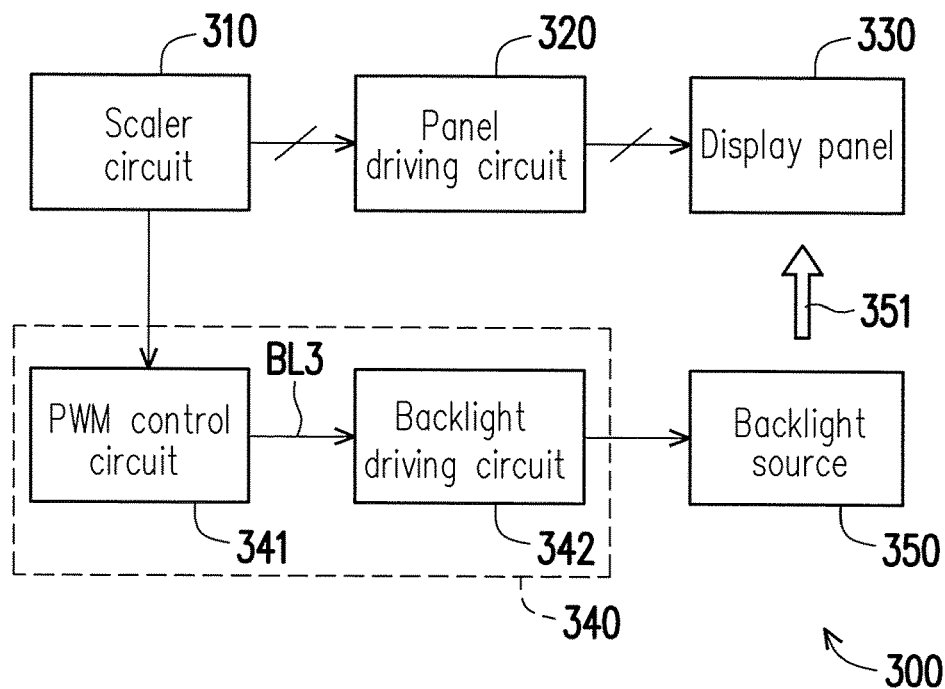
FIG. 3 is a schematic circuit block diagram illustrating a display device according to an embodiment of the invention.

FIG. 3 is a schematic circuit block diagram illustrating a display device 300 according to an embodiment of the invention. The display device 300 includes a video processing circuit, which is, for example, a scaler circuit 310 and/or any other video signal processing circuit. The display device 300 further includes a panel driving circuit 320, a display panel 330, a synchronous backlight device 340 and a backlight source 350. The scalar circuit 310 (i.e., the video processing circuit) may transmit a clock signal, video sync information and video data to the panel driving circuit 320, so as to control the panel driving circuit to drive the display panel 330. Based on a design requirement, the video sync information may include a vertical sync signal, a horizontal sync signal, a data enablement signal and/or any other sync signal. The vertical sync signal may define a plurality of video frame periods. Based on a design requirement, the display panel 330 may be a liquid crystal display (LCD) panel or a display panel of any other type. The scalar circuit 310, the panel driving circuit 320 and the display panel 330 are conventional components and thus, will not be repeatedly described.

In the embodiment illustrated in FIG. 3, the synchronous backlight device 340 may receive the video sync information from the video processing circuit (e.g., the scalar circuit 310). According to the video sync information, the synchronous backlight device 340 may control/drive the backlight source in a synchronous manner. The synchronous backlight device 340 may perform global backlight control or local backlight control on the backlight source 350. The backlight source 350 may provide backlight 351 to the display panel 330. Based on a design requirement, the backlight source 350 may be a direct type backlight module or an edge-lighting type backlight module. As the synchronous backlight device 340 controls/drives the backlight source in the synchronous manner, the issue of motion blur may be effectively improved.

In the embodiment illustrated in FIG. 3, the synchronous backlight device 340 includes a pulse width modulation (PWM) control circuit 341 and a backlight driving circuit 342. The PWM control circuit 341 is coupled to the video processing circuit (e.g., the scalar circuit 310) to receive the video sync information (e.g., the vertical sync signal, the data enablement signal and/or any other sync signal). The PWM control circuit 341 may generate a PWM control signal BL3. The backlight driving circuit 342 is coupled to the PWM control circuit 341 to receive the PWM control signal BL3. According to the PWM control signal BL3, the backlight driving circuit 342 may drive the backlight source 350 of the display panel 330. The PWM control circuit 341 may perform the global backlight control or the local backlight control on the backlight source 350.

Figure 4:
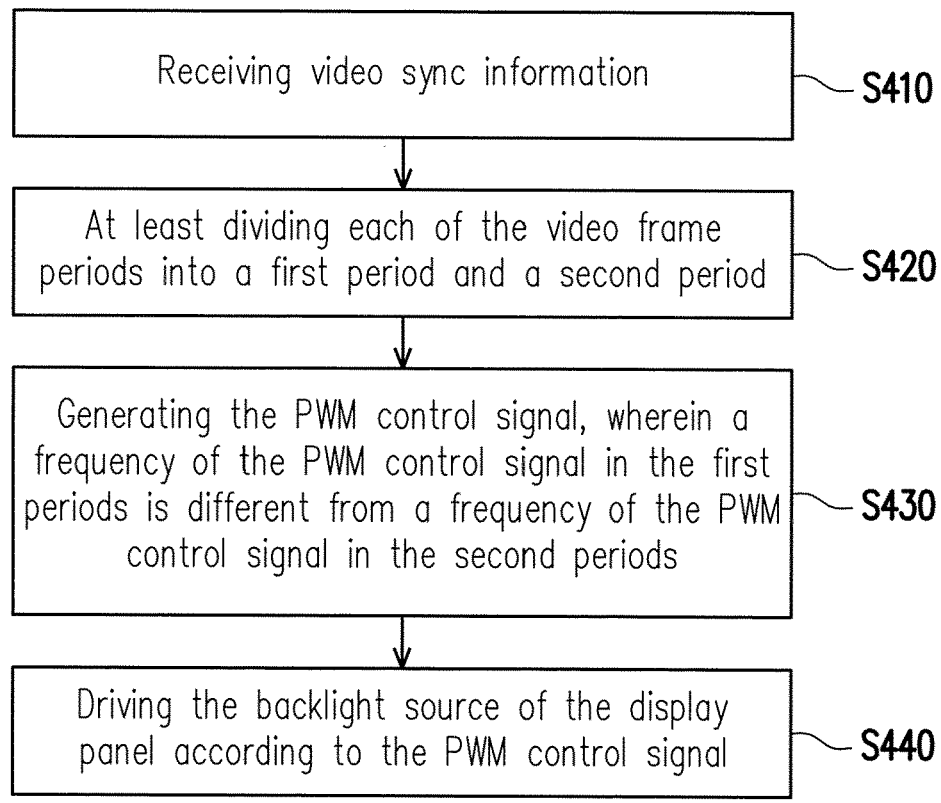
FIG. 4 is a flowchart illustrating an operation method of a synchronous backlight device according to an embodiment of the invention.

FIG. 4 is a flowchart illustrating an operation method of a synchronous backlight device according to an embodiment of the invention. Referring to FIG. 3 and FIG. 4, in step S410, the PWM control circuit 341 receives the video sync information (e.g., the vertical sync signal, the data enablement signal and/or any other sync signal) from the video processing circuit (e.g., the scalar circuit 310). The video sync information defines a plurality of video frame periods. In step S420, the PWM control circuit 341 at least divides each of the video frame periods into a first period and a second period, wherein lengths of the first periods of various video frame periods are equal to one another.

Figure 5:
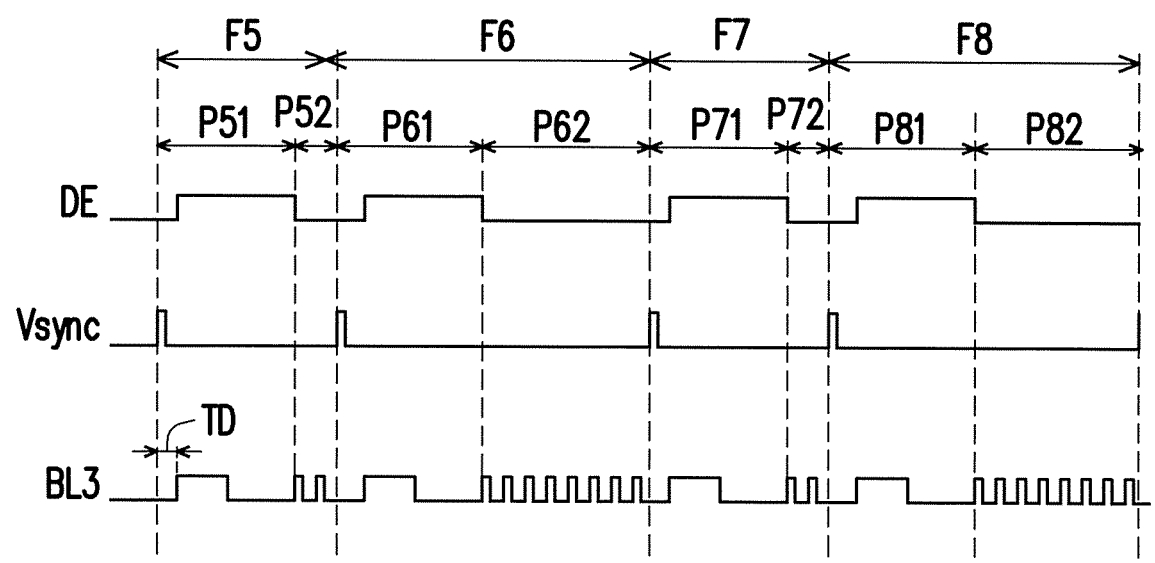
FIG. 5 is a schematic waveform diagram of the phase width modulation (PWM) control signal depicted in FIG. 3 according to an embodiment of the invention.

FIG. 5 is a schematic waveform diagram of the PWM control signal BL3 depicted in FIG. 3 according to an embodiment of the invention. In FIG. 5, the vertical axis represents the voltage, and the horizontal axis represents the time. In the implementation example illustrated in FIG. 5, it is assumed that the PWM control circuit 341 receives the vertical sync signal Vsync (i.e., the video sync information) from the video processing circuit (e.g., the scalar circuit 310). Referring to FIG. 3, FIG. 4 and FIG. 5, the vertical sync signal Vsync (i.e., the video sync information) defines a plurality of video frame periods, for example, video frame periods F5, F6, F7 and F8 as illustrated in FIG. 5. In another implementation example, the PWM control circuit 341 receives the data enablement signal DE (i.e., the video sync information) from the video processing circuit (e.g., the scalar circuit 310). The data enablement signal DE (i.e., the video sync information) also can define a plurality of video frame periods, for example, video frame periods F5, F6, F7 and F8 as illustrated in FIG. 5.

In step S420, the PWM control circuit 341 at least divides each of the video frame periods into a first period and a second period. Based on a design requirement, a first periods includes part or all of a data period of each of the video frame periods, and a second periods includes part or all of a blanking period of each of the video frame periods.

For instance, according to the data enablement signal DE in the video sync information, the video frame period F5 is at least divided into a first period P51 and a second period P52, the video frame period F6 is at least divided into a first period P61 and a second period P62, the video frame period F7 is at least divided into a first period P71 and a second period P72, and the video frame period F8 is at least divided into a first period P81 and a second period P82. Lengths of the first periods P51, P61, P71 and P81 of the video frame periods F5 to F8 are equal to one another. The first period P51 includes a data period of the video frame period F5, and the second period P52 includes a blanking period of the video frame period F5. The first period P61 includes a data period of the video frame period F6, and the second period P62 includes a blanking period of the video frame period F6. The first period P71 includes a data period of the video frame period F7, and the second period P72 includes a blanking period of the video frame period F7. The first period P81 includes a data period of the video frame period F8, and the second period P82 includes a blanking period of the video frame period F8.

In step S430, the PWM control circuit 341 generates the PWM control signal BL3. A frequency of the PWM control signal BL3 in the first periods is different from a frequency of the PWM control signal BL3 in the second periods, but a duty ratio of the PWM control signal BL3 in the first periods is equal to a duty ratio of the PWM control signal BL3 in the second periods. For instance, the frequency of the PWM control signal BL3 in the first period P51 is different from the frequency of the PWM control signal BL3 in the second period P52, but the duty ratio of the PWM control signal BL3 in each duty cycle of the first period P51 is equal to the duty ratio of the PWM control signal BL3 in each duty cycle of the second period P52.

In the embodiment illustrated in FIG. 5, the frequency of the PWM control signal BL3 in the first periods is less than the frequency of the PWM control signal BL3 in the second periods. For instance, the frequency of the PWM control signal BL3 in the first period P51 is less than the frequency of the PWM control signal BL3 in the second period P52.

The backlight driving circuit 342 is coupled to the PWM control circuit 341 to receive the PWM control signal BL3. In step S440, the backlight driving circuit 342 drives the backlight source 350 of the display panel 330 according to the PWM control signal BL3, such that the backlight source 350 is driven to provide the backlight 351 to the display panel 330.

Based on the above, the synchronous backlight device 340 and the operation method thereof provided by the present embodiment, each video frame period is at least divided into the first period and the second period. The lengths of the first periods of various video frame periods are equal to one another. If the length of each video frame period is changed, the lengths of the second periods are changed along therewith, but the lengths of the first periods are not. The frequency of the PWM control signal BL3 in the first periods is different from the frequency of the PWM control signal BL3 in the second periods, but the duty ratio of the PWM control signal BL3 in each first period is equal to the duty ratio of the PWM control signal BL3 in each second period. Thus, with the backlight source 350 being driven/controlled to provide compensation light (i.e., the backlight 351) in the second periods, the average backlight brightness in various video frame periods F5 to F8 may tend to be approximately equal to one another. In other words, the synchronous backlight device 340 and the operation method thereof can achieve improving the issue of backlight flicker.

Figure 6:
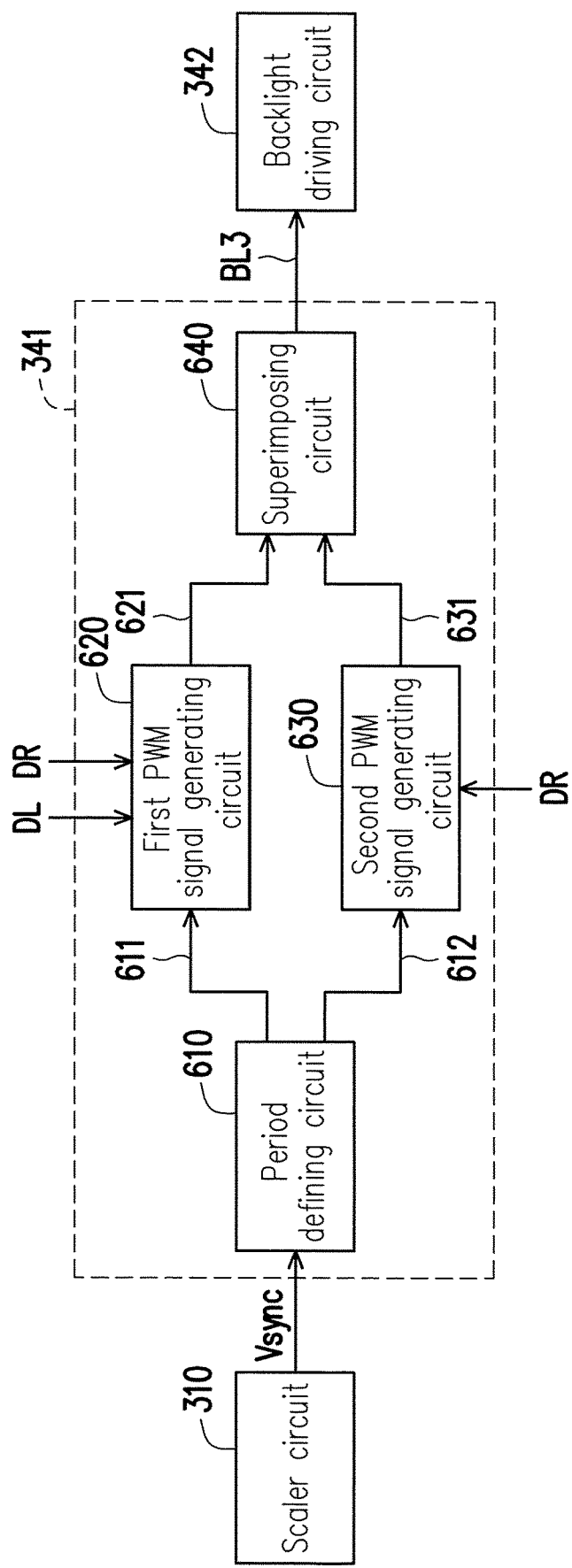
FIG. 6 is a schematic circuit block diagram illustrating the PWM control circuit depicted in FIG. 3 according to an embodiment of the invention.

FIG. 6 is a schematic circuit block diagram illustrating the PWM control circuit depicted in FIG. 3 according to an embodiment of the invention. In the embodiment illustrated in FIG. 6, the PWM control circuit 341 includes a period defining circuit 610, a first PWM signal generating circuit 620, a second PWM signal generating circuit 630 and a superimposing circuit 640. The period defining circuit 610 is coupled to the video processing circuit (e.g., the scalar circuit 310) to receive the video sync information (e.g., the vertical sync signal Vsync) from the video processing circuit. According to a timing of the vertical sync signal Vsync (i.e., the video sync information), the period defining circuit 610 may generate a first enablement signal 611 and a second enablement signal 612. The first enablement signal 611 may define the first periods, and the second enablement signal 612 may define the second periods.

Figure 7:
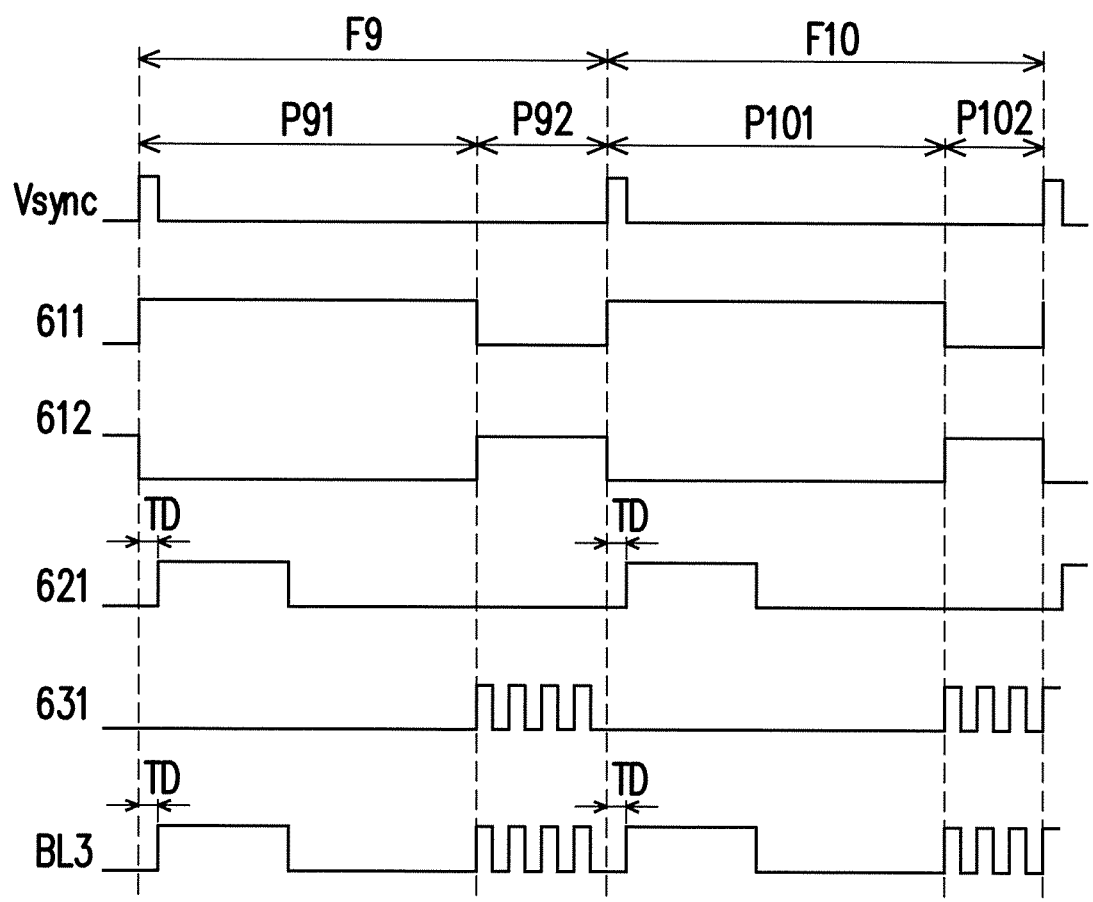
FIG. 7 is a schematic waveform diagram of the signals depicted in FIG. 6 according to an embodiment of the invention.

For instance, FIG. 7 is a schematic waveform diagram of the signals depicted in FIG. 6 according to an embodiment of the invention. In FIG. 7, the vertical axis represents the voltage, and the horizontal axis represents the time. The vertical sync signal Vsync defines a plurality of video frame periods, for example, video frame periods F9 and F10 as illustrated in FIG. 7. The video frame period F9 is at least divided into a first period P91 and a second period P92, and the video frame period F10 is at least divided into a first period P101 and a second period P102. The first enablement signal 611 may define the first periods P91 and P101, and the second enablement signal 612 may define the second periods P92 and P102. Lengths of the first periods P91 and P101 are equal to each other. If lengths of the video frame periods are changed, lengths of the second periods P92 and P102 are also changed along therewith, but lengths of the first periods P91 and P101 are not.

Referring to FIG. 6 and FIG. 7, the first PWM signal generating circuit 620 is coupled to the period defining circuit 610 to receive the first enablement signal 611. The first PWM signal generating circuit 620 may generate the first PWM signal 621 according to the first enablement signal 611 in the first periods. The first PWM signal generating circuit 620 may determine a duty ratio of the first PWM signal 621 in each first period according to a duty ratio parameter DR. It is assumed that the duty ratio is 50% in the embodiment illustrated in FIG. 7, while the duty ratio may be adjusted based on use requirements in other embodiments. The first PWM signal generating circuit 620 may further determine a phase of the first PWM signal 621 in each first period according to the delay parameter DL.

In the embodiment illustrated in FIG. 7, when the first enablement signal 611 is at a low level, the first PWM signal generating circuit 620 is disabled. When the first enablement signal 611 is at a high level, the first PWM signal generating circuit 620 is enabled. Thus, the first PWM signal generating circuit 620 may generate the first PWM signal 621 in the first periods P91 and P101. The first PWM signal generating circuit 620 may set the duty ratio of the first PWM signal 621 in the first periods P91 and P101 to 50% according to the duty ratio parameter DR. The first PWM signal generating circuit 620 may further determine a time of delay TD of a pulse of the first PWM signal 621 in the first periods P91 and P101 according to the delay parameter DL, i.e., determine a phase of the first PWM signal 621 in the first periods P91 and P101.

The second PWM signal generating circuit 630 is coupled to the period defining circuit 610 to receive the second enablement signal 612. The second PWM signal generating circuit 630 may generate the second PWM signal 631 according to the second enablement signal 612 in the second periods. The second PWM signal generating circuit 630 may determine a duty ratio of the second PWM signal 631 in the second periods according to the same duty ratio parameter DR. In the embodiment illustrated in FIG. 7, when the second enablement signal 612 is at a low level, the second PWM signal generating circuit 630 is disabled. When the second enablement signal 612 is at a high level, the second PWM signal generating circuit 630 is enabled. Thus, the second PWM signal generating circuit 630 may generate the second PWM signal 631 in the second periods P92 and P102. The second PWM signal generating circuit 630 may set the duty ratio of the second PWM signal 631 in the second periods P92 and P102 to 50% according to the duty ratio parameter DR. A frequency of the second PWM signal 631 in the second periods P92 and P102 is different from a frequency of the first PWM signal 621 in the first periods P91 and P101.

The superimposing circuit 640 is coupled to the first PWM signal generating circuit 620 to receive the first PWM signal 621. The superimposing circuit 640 is coupled to the second PWM signal generating circuit 630 to receive the second PWM signal 631. The superimposing circuit 640 may superimpose the first PWM signal 621 and the second PWM signal 631 to obtain the PWM control signal BL3, as illustrated in FIG. 7.

Figure 8:
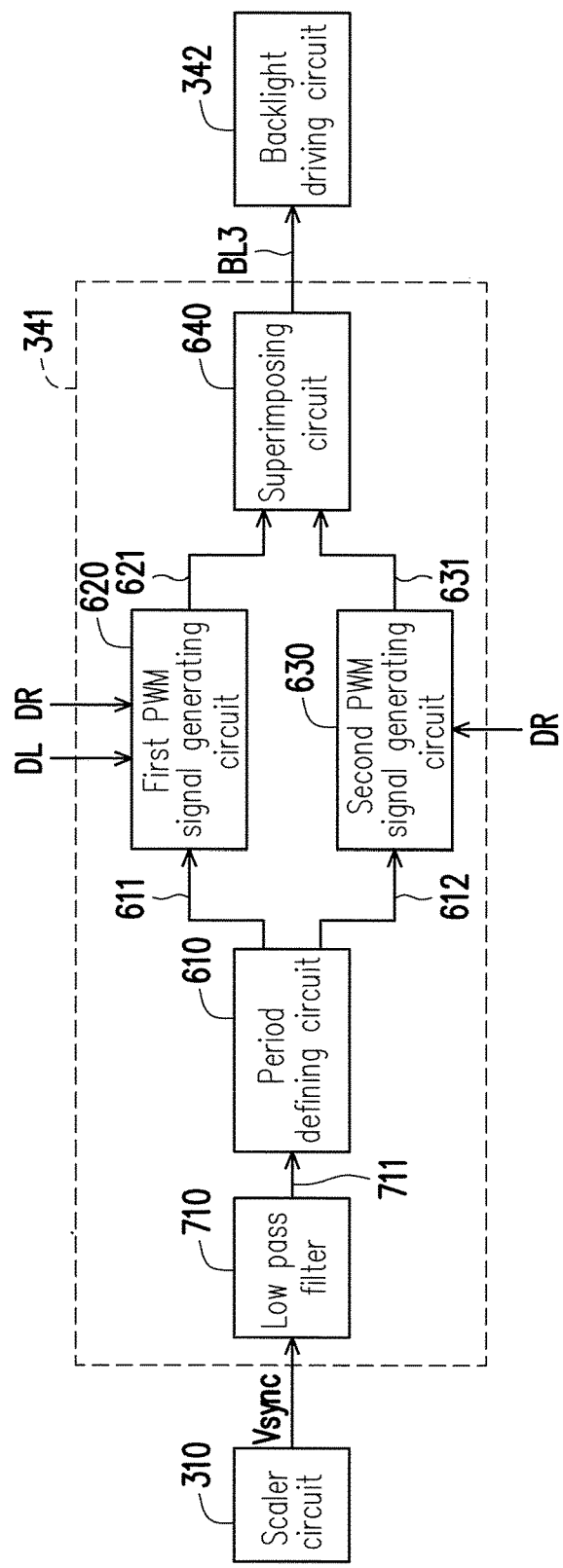
FIG. 8 is a schematic circuit block diagram illustrating the PWM control circuit depicted in FIG. 3 according to another embodiment of the invention.

FIG. 8 is a schematic circuit block diagram illustrating the PWM control circuit 341 depicted in FIG. 3 according to another embodiment of the invention. In the embodiment illustrated in FIG. 8, the PWM control circuit 341 includes a low pass filter 710, a period defining circuit 610, a first PWM signal generating circuit 620, a second PWM signal generating circuit 630 and a superimposing circuit 640. The period defining circuit 610, the first PWM signal generating circuit 620, the second PWM signal generating circuit 630 and the superimposing circuit 640 illustrated in FIG. 8 may be inferred with reference to the descriptions related to the embodiment illustrated in FIG. 6 and FIG. 7 and thus, will not be repeated.

Figure 9:
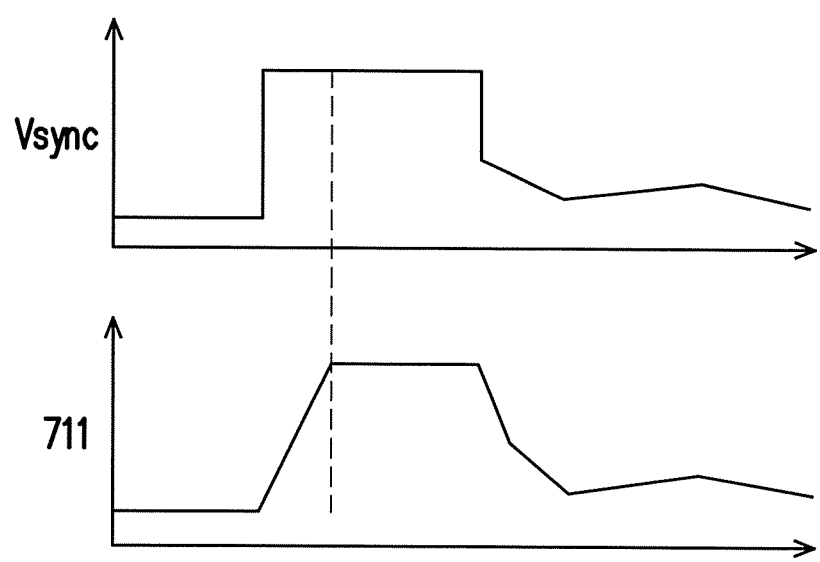
FIG. 9 is a schematic waveform diagram of the vertical sync signal and the smoothed signal depicted in FIG. 8 according to an embodiment of the invention.

In the embodiment illustrated in FIG. 8, the low pass filter 710 is coupled to the video processing circuit (e.g., the scalar circuit 310) to receive the video sync information (e.g., the vertical sync signal Vsync) from the video processing circuit. The low pass filter 710 may output a smoothed signal 711 to the period defining circuit 610. FIG. 9 is a schematic waveform diagram of the vertical sync signal Vsync and the smoothed signal 711 depicted in FIG. 8 according to an embodiment of the invention. As illustrated in FIG. 9, the low pass filter 710 may smooth the vertical sync signal Vsync to generate the smoothed signal 711. The period defining circuit 610 is coupled to the low pass filter 710 to receive the smoothed signal 711. The period defining circuit 610 may generate the first enablement signal 611 and the second enablement signal 612 according to a timing of the smoothed signal 711.

It should be noted that in different application scenarios, related functions of the synchronous backlight device 340, the PWM control circuit 341 and/or the backlight driving circuit 342 may be implemented in a form of software, firmware or hardware by employing general programming languages (e.g., C or C++), hardware description languages (e.g., Verilog HDL or VHDL) or other suitable programming languages. The programming languages capable of executing the related functions may be deployed in any computer-accessible media, such as magnetic tapes, semiconductor memories, magnetic disks or compact disks (e.g., CD-ROM or DVD-ROM) or may be delivered through the Internet, wired communication, wireless communication or other communication media. The programming languages may be stored in the computer-accessible media for a processor of the computer to access/execute the programming codes of the software (or firmware). In the implementation in the hardware form, one or more controllers, the functions of the embodiments of the invention can be implemented or executed by one or more controllers, microcontrollers, microprocessors, application-specific integrated circuits (ASICs), digital signal processors (DSPs), field programmable gate array (FPGAs) and/or other various logical blocks, modules and circuits in other processing units. In addition, the device and the method of the invention can be implemented through a combination of hardware and software.

In light of the foregoing, the synchronous backlight device and the operation method thereof provided by the embodiments of the invention can control/drive the backlight source synchronously, and therefore, the issue of motion blur can be effectively improved. The synchronous backlight device and the operation method thereof can be applied in the backlight control scenarios where the vertical sync signal is variable, or the vertical sync signal is fixed. In the synchronous backlight device and the operation method thereof, each of the video frame periods can be at least divided into the first period and the second period. The lengths of the first periods of various video frame periods are equal to one another. If the lengths of the video frame periods are changed, the lengths of the second periods are also changed along therewith, but the lengths of the first periods are not. The frequency of the PWM control signal BL3 in the first periods is different from the frequency of the PWM control signal BL3 in the second periods, but the duty ratio of the PWM control signal BL3 in the first periods is equal to the duty ratio of the PWM control signal BL3 in the second periods. Thus, with the backlight source 350 being driven to provide the compensation light (i.e., the backlight 351) in the second periods, the average backlight brightness in various video frame periods can tend to be approximately equal to one another. In other words, the synchronous backlight device and the operation method thereof can achieve improving the issue of backlight flicker.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A synchronous backlight device, comprising:
a pulse width modulation (PWM) control circuit, configured to receive video sync information from a video processing circuit and generate a PWM control signal, wherein the video sync information defines a plurality of video frame periods, and the PWM control circuit at least divides each of the video frame periods into different sub-frame periods including a first period and a second period, wherein lengths of the first periods of at least two of the video frame periods are substantially equal, and lengths of the second periods of the at least two of the video frame periods are different, and the PWM control signal in each of the second periods of the video frame periods has substantially a same frequency; and
a backlight driving circuit, coupled to the PWM control circuit to receive the PWM control signal, and configured to drive a backlight source of a display panel according to the PWM control signal,
wherein a flicker effect of the backlight source is reduced by performing a PWM setting operation in each of the sub-frame periods,
wherein the PWM setting operation represents that a first frequency of the PWM control signal in each of the first periods is different from a second frequency of the PWM control signal in each of the second periods, and a first duty ratio of the PWM control signal in each of the first periods is equal to a second duty ratio of the PWM control signal in each of the second periods.

2. The synchronous backlight device according to claim 1, wherein the video processing circuit comprises a scalar circuit, and the video sync information comprises a vertical sync signal.

3. The synchronous backlight device according to claim 1, wherein the PWM control circuit at least divides each of the video frame periods into the first period and the second period according to the video sync information, the first period comprises part or all of a data period of one of the video frame periods, and the second period comprises part or all of a blanking period of the one of the video frame periods.

4. The synchronous backlight device according to claim 1, wherein the first frequency of the PWM control signal in each of the first periods is less than the second frequency of the PWM control signal in each of the second periods.

5. The synchronous backlight device according to claim 1, wherein the PWM control circuit comprises:
a period defining circuit, configured to receive the video sync information from the video processing circuit and generate a first enablement signal and a second enablement signal according to a timing of the video sync information, wherein the first enablement signal defines the first periods, and the second enablement signal defines the second periods;
a first PWM signal generating circuit, coupled to the period defining circuit to receive the first enablement signal, and configured to generate a first PWM signal according to the first enablement signal in the first periods and determine a duty ratio of the first PWM signal in the first periods according to a duty ratio parameter;
a second PWM signal generating circuit, coupled to the period defining circuit to receive the second enablement signal, and configured to generate a second PWM signal according to the second enablement signal in the second periods and determine a duty ratio of the second PWM signal in the second periods according to the duty ratio parameter, wherein a frequency of the second PWM signal is different from a frequency of the first PWM signal; and
a superimposing circuit, coupled to the first PWM signal generating circuit to receive the first PWM signal, coupled to the second PWM signal generating circuit to receive the second PWM signal, and configured to superimpose the first PWM signal and the second PWM signal to obtain the PWM control signal.

6. The synchronous backlight device according to claim 5, wherein the first PWM signal generating circuit further determines a phase of the first PWM signal in the first periods according to a delay parameter.

7. The synchronous backlight device according to claim 1, wherein the PWM control circuit comprises:
a low pass filter, configured to receive the video sync information from the video processing circuit and output a smoothed signal;
a period defining circuit, coupled to the low pass filter to receive the smoothed signal and generate a first enablement signal and a second enablement signal according to a timing of the smoothed signal, wherein the first enablement signal defines the first periods, and the second enablement signal defines the second periods;
a first PWM signal generating circuit, coupled to the period defining circuit to receive the first enablement signal, and configured to generate a first PWM signal in the first periods according to the first enablement signal and determine a duty ratio of the first PWM signal in the first periods according to a duty ratio parameter;
a second PWM signal generating circuit, coupled to the period defining circuit to receive the second enablement signal, and configured to generate a second PWM signal in the second periods according to the second enablement signal and determine a duty ratio of the second PWM signal in the second periods according to the duty ratio parameter, wherein the frequency of the second PWM signal is different from the frequency of the first PWM signal; and
a superimposing circuit, coupled to the first PWM signal generating circuit to receive the first PWM signal, coupled to the second PWM signal generating circuit to receive the second PWM signal, configured to superimpose the first PWM signal and the second PWM signal to obtain the PWM control signal.

8. An operation method of a synchronous backlight device, comprising:
receiving video sync information from a video processing circuit, wherein the video sync information defines a plurality of video frame periods;
at least dividing each of the video frame periods into different sub-frame periods including a first period and a second period by a PWM control circuit, wherein lengths of the first periods of at least two of the video frame periods are substantially equal, and lengths of the second periods of the at least two of the video frame periods are different;
generating a PWM control signal by the PWM control circuit, wherein the PWM control signal in each of the second periods has substantially a same frequency; and
driving a backlight source of a display panel by a backlight driving circuit according to the PWM control signal,
wherein a flicker effect of the backlight source is reduced by performing a PWM setting operation in each of the sub-frame periods, wherein the PWM setting operation represents that a first frequency of the PWM control signal in each of the first periods is different from a second frequency of the PWM control signal in each of the second periods, and a first duty ratio of the PWM control signal in each of the first periods is equal to a second duty ratio of the PWM control signal in each of the second periods.

9. The operation method according to claim 8, wherein the video processing circuit comprises a scalar circuit, and the video sync information comprises a vertical sync signal.

10. The operation method according to claim 8, wherein the PWM control circuit at least divides each of the video frame periods into the first period and the second period according to the video sync information, the first period comprises part or all of a data period of one of the video frame periods, and the second period comprises part or all of a blanking period of the one of the video frame periods.

11. The operation method according to claim 8, wherein the first frequency of the PWM control signal in each of the first periods is less than the second frequency of the PWM control signal in each of the second periods.

12. The operation method according to claim 8, wherein the step of generating the PWM control signal comprises:
generating a first enablement signal and a second enablement signal according to a timing of the video sync information by a period defining circuit, wherein the first enablement signal defines the first periods, and the second enablement signal defines the second periods;
generating a first PWM signal according to the first enablement signal in the first periods and determining a duty ratio of the first PWM signal in the first periods according to a duty ratio parameter by a first PWM signal generating circuit;
generating a second PWM signal according to the second enablement signal in the second periods and determining a duty ratio of the second PWM signal in the second periods according to the duty ratio parameter by a second PWM signal generating circuit, wherein a frequency of the second PWM signal is different from a frequency of the first PWM signal; and
superimposing the first PWM signal and the second PWM signal to obtain the PWM control signal by a superimposing circuit.

13. The operation method according to claim 12, wherein the first PWM signal generating circuit further defines a phase of the first PWM signal in the first periods according to a delay parameter.

* * * * *